US007310229B2

(12) United States Patent
Lee et al.

(10) Patent No.: US 7,310,229 B2
(45) Date of Patent: Dec. 18, 2007

(54) HEAT DISSIPATING DEVICE

(75) Inventors: Hsieh-Kun Lee, Tu-Cheng (TW); Wan-Lin Xia, Shenzhen (CN); Bao-Chun Chen, Shenzhen (CN)

(73) Assignees: Fu Zhun Precision Industry (Shenzhen) Co., Ltd., Bao'an District, Shenzhen, Guangdong (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 368 days.

(21) Appl. No.: 11/065,387

(22) Filed: Feb. 24, 2005

(65) Prior Publication Data

US 2006/0098408 A1 May 11, 2006

(30) Foreign Application Priority Data

Jun. 11, 2004 (CN) ........................ 2004 2 0047058

(51) Int. Cl.
*H05K 7/20* (2006.01)
*H01L 23/40* (2006.01)

(52) U.S. Cl. ...................... 361/697; 361/709; 361/710; 257/718; 257/719

(58) Field of Classification Search ................ 361/697, 361/709, 710; 257/718, 719, E23.083, E23.086
See application file for complete search history.

(56) References Cited

U.S. PATENT DOCUMENTS 5,603,374 A * 2/1997 Wu ........................... 165/80.3
5,757,621 A 5/1998 Patel
5,901,039 A 5/1999 Dehaine et al.
5,969,950 A * 10/1999 Tantoush .................... 361/704
6,157,539 A * 12/2000 Wagner et al. .............. 361/704
6,304,452 B1 10/2001 Lo
6,307,748 B1 * 10/2001 Lin et al. .................... 361/704
6,317,328 B1 * 11/2001 Su ............................ 361/704
6,374,906 B1 * 4/2002 Peterson et al. ........... 165/80.3
6,392,889 B1 * 5/2002 Lee et al. ................... 361/704
6,412,546 B1 * 7/2002 Lin et al. ................... 165/80.3
6,480,387 B1 11/2002 Lee et al.
6,585,534 B2 * 7/2003 Llapitan et al. ............. 439/327
6,606,254 B2 * 8/2003 Yoneda ...................... 361/799
6,667,885 B2 12/2003 Malone et al.
6,697,256 B1 * 2/2004 Horng et al. ............... 361/704

(Continued)

FOREIGN PATENT DOCUMENTS

CN 01269676.5 10/2002

(Continued)

*Primary Examiner*—Anatoly Vortman
(74) *Attorney, Agent, or Firm*—Morris Manning Martin LLP; Tim Tingkang Xia, Esq.

(57) ABSTRACT

A heat dissipating device of the present invention includes a heat sink (20) and two locking devices (10) for securing the heat sink. The heat sink includes a base (22) for contacting an electronic component. Each locking device includes a spring member, a post (12) and a sleeve (18). The spring member elastically rests on the base. The post extends through the sleeve. The post has one end engaging with the spring member, and an opposite end thereof extending beyond the sleeve for locking the combination. The sleeve has one end tightly grasping the post, and an opposite end thereof preventing the locking device from departing from the heat sink.

15 Claims, 3 Drawing Sheets

U.S. PATENT DOCUMENTS 6,752,577 B2 * 6/2004 Chen et al. ................. 411/508
6,826,054 B2 * 11/2004 Liu ............................ 361/719
6,920,052 B2 * 7/2005 Callahan et al. ............ 361/767
7,019,979 B2 * 3/2006 Wang et al. ................ 361/719
7,164,583 B2 * 1/2007 Lee et al. ................... 361/704
2002/0067599 A1 * 6/2002 Mann ......................... 361/704

FOREIGN PATENT DOCUMENTS

CN 02200386.X 11/2002
TW 406824 9/2000
TW 578981 3/2004

* cited by examiner

HEAT DISSIPATING DEVICE

TECHNICAL FIELD

The present invention relates to a heat dissipating device, and particularly to a heat dissipating device with a locking device which can mount a heat sink to an electronic component.

BACKGROUND

As computer technology continues advancing, electronic components of computers are made to provide faster operational speed and greater functional capabilities. When an electronic component operates at a high speed in a computer enclosure, its temperature increases greatly and dramatically, which can make the electronic component operate unstably. It is desirable to dissipate the generated heat quickly, for example, by using a heat dissipating device attached to the electronic component in the enclosure.

Numerous heat dissipating devices for dissipating heat generated by electronic components mounted on a circuit board are known. For instance, China Patent No. ZL 02200386.X discloses a heat dissipating device. The heat dissipating device comprises a heat sink and a locking device for securing the heat sink to an electronic component. The locking device comprises an elongated strap for being received in a slot defined in the heat sink, and two pins each of which has two leaf-shaped barbs at a bottom end thereof. The pins are installed in two ends of the strap. In use, the strap of the locking device is received in the slot of the heat sink. The two pins pass through two holes defined in the circuit board respectively to make the barbs engaged with the rear of the circuit board, and the strap presses the heat sink. Therefore, the heat sink thermally contacts the electronic component. However, the locking device can not be assembled on the heat sink before the heat sink puts to use, and parts away the heat sink during transportation, thereby resulting in much trouble.

SUMMARY OF THE INVENTION

Accordingly, an object of the present invention is to provide a heat dissipating device with a locking device which can be assembled on a heat sink before the heat sink put to use, thereby facilitating transportation.

To achieve the above-mentioned object, a heat dissipating device of the present invention comprises a heat sink and two locking devices for securing the heat sink. The heat sink comprises a base for contacting an electronic component. Each locking device comprises a spring member, a post and a sleeve. The spring member elastically rests on the base. The post extends through the sleeve. The post has one end engaging with the spring member, and an opposite end thereof extending beyond the sleeve for locking the combination. The sleeve has one end tightly grasping the post, and an opposite end thereof preventing the locking device from departing from the heat sink.

Other objects, advantages and novel features of the present invention will be drawn from the following detailed description of a preferred embodiment of the present invention with attached drawings, in which:

DETAILED DESCRIPTION OF THE INVENTION

Figure 1:
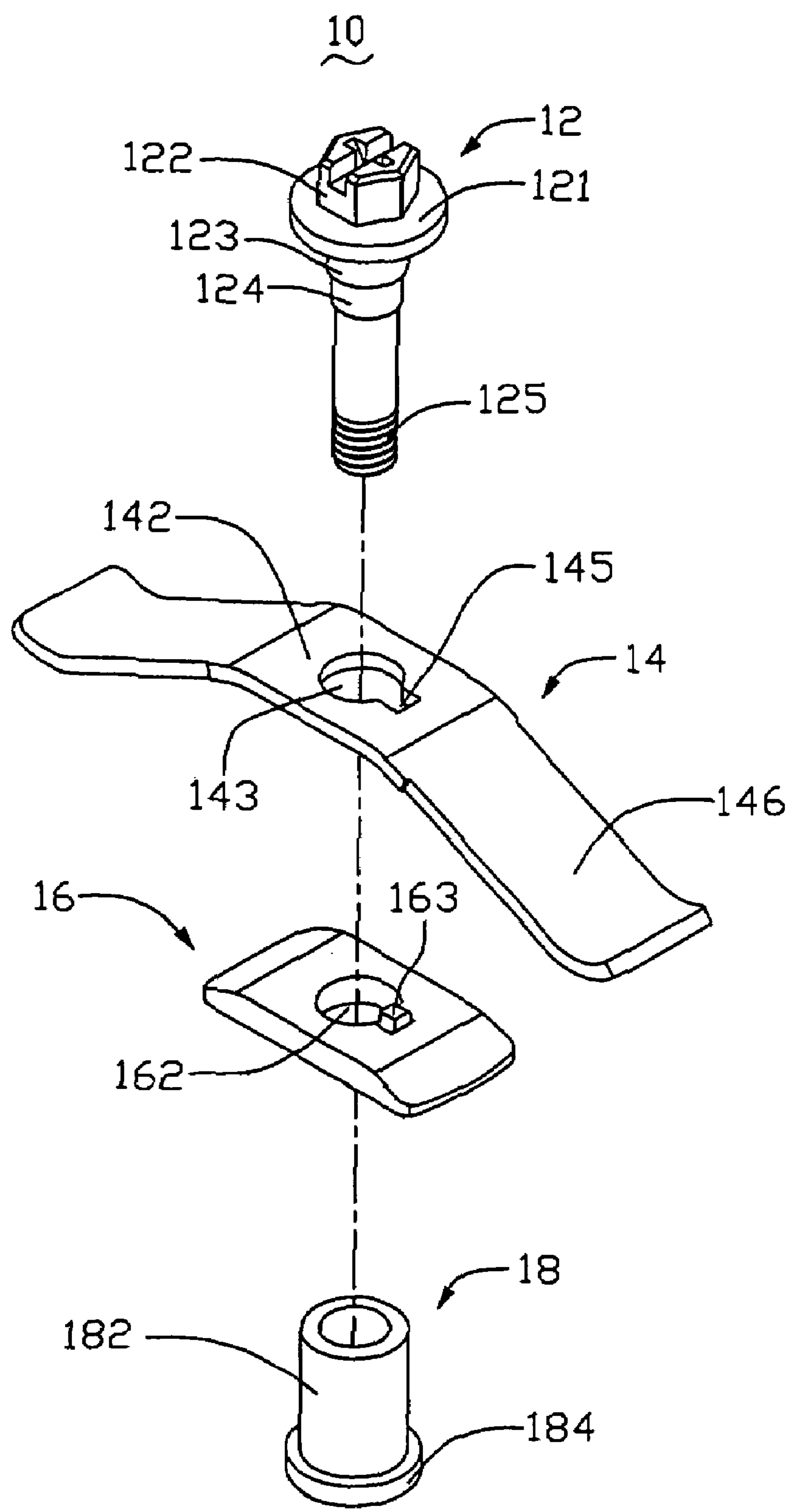
FIG. 1 is an exploded, isometric view of a locking device in accordance with the present invention.
Figure 2:
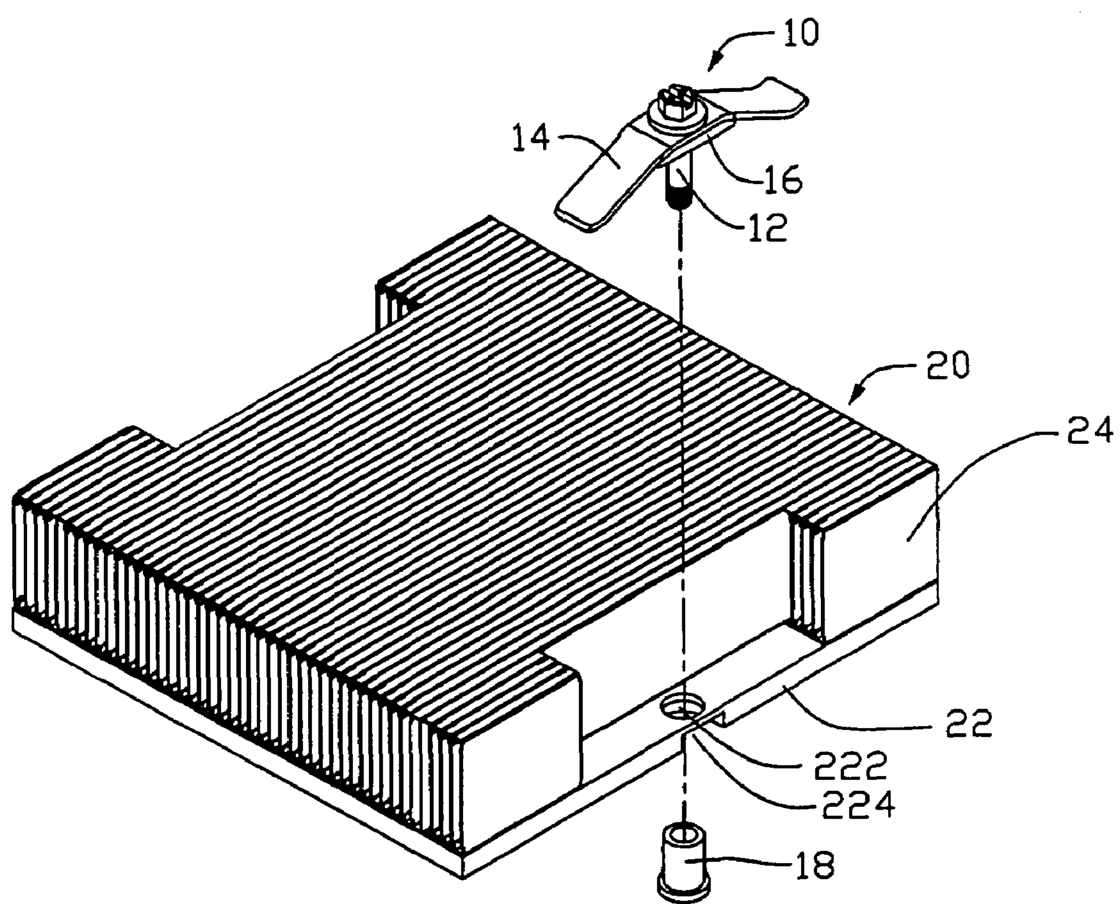
FIG. 2 is a partially exploded, isometric view of a heat dissipating device in accordance with the present invention.

FIGS. 1-2 show a heat dissipating device in accordance with a preferred embodiment of the present invention. The heat dissipating device comprises a heat sink 20 for dissipating heat, and a locking device 10 for securing the heat sink 20 to a heat generating electronic component (not shown) mounted on a circuit board (not shown).

The heat sink 20 comprises a base 22 and a plurality of fins 24 arranged on the base 22. The base 22 has a first surface and a second surface opposite to the first surface. The base 22 defines two holes 222 through the first surface and the second surface at a center of a couple of opposite sides thereof respectively Two flutes 224 are defined in the base 22, beneath the holes 222 respectively and communicating with the holes 222.

The locking device 10 comprises a post 12, a spring leaf 14 clothing on the post 12 for elastically pressing the heat sink 20, and a sleeve 18 for locking the post 12 to the heat sink 20.

The post 12 comprises an expanding head 121 at an end thereof, a neck 123 adjacent the head 121, a locking portion 124 next to the neck 123, and a thread portion 125 at an opposite end thereof. The head 121 has a project 122 at a top thereof for facilitating a tool working. The neck 123 is for engaging with the spring leaf 14. The locking portion 124 is for coupling with the sleeve 18. The thread portion 125 is for engaging with the circuit board.

The spring leaf 14 comprises a shoulder 142 and two elastic arms 146 extending slantingly and downwardly from opposite ends of the shoulder 142. An aperture 143 is defined in a center of the shoulder 142, for matching with the neck 123 of the post 12.

The sleeve 18 comprises a hollow column 182 and a flange 184 formed at a rim of the bottom end of the column 182. The flange 184 is for preventing the locking device 10 from departing from the heat sink 20. The flange 184 can be received in the flute 224 of the base 22 and beneath the hole 222.

The locking device 10 further comprises a pillow 16 for supporting the spring leaf 14 at the neck 123. A bore 162 is defined in a center of the pillow 16 for matching with the neck 123. A tab 163 is protruded upwardly from a brim of the bore 162, for matching with a cutout 145 defined in a rim of the aperture 143.

Figure 3:
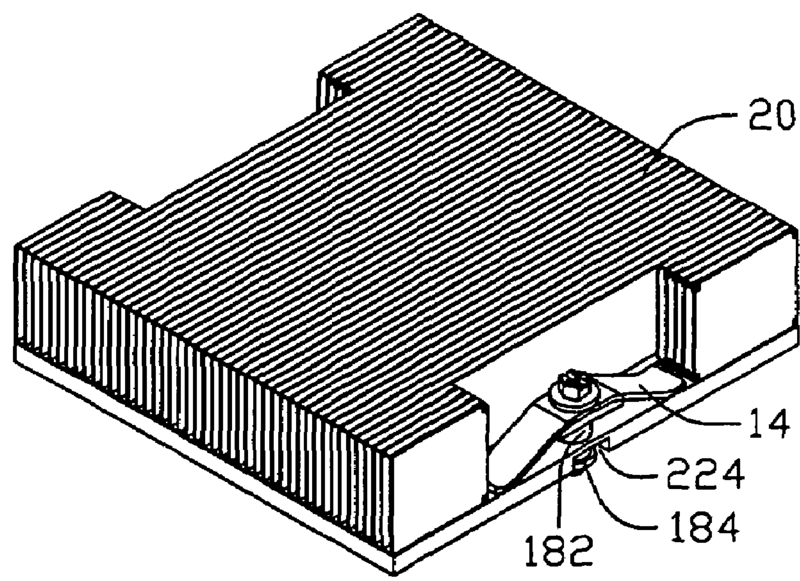
FIG. 3 is an assembled view of FIG. 2.
Figure 4:
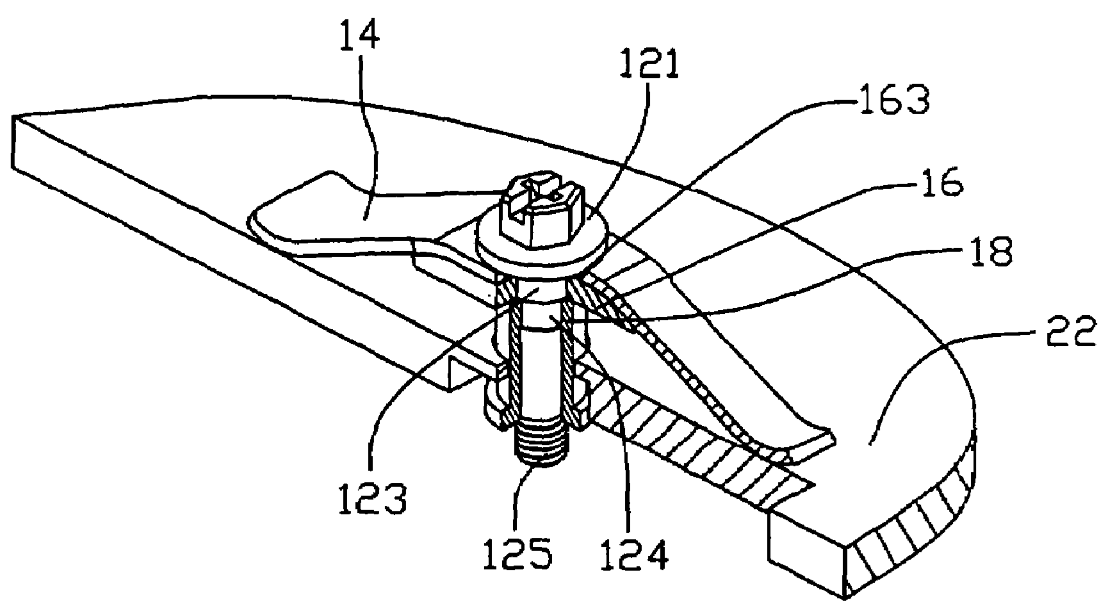
FIG. 4 is a partially cross-sectional view of FIG. 3.

Referring also to FIGS. 2-4, to assemble the locking device 10, the spring leaf 14 and the pillow 16 are clothed on the post 12. The pillow 16 is disposed beneath the shoulder 142 of the spring leaf 14. The tab 163 of the pillow 16 is received in the cutout 145 of the spring leaf 14. The post 12 is extended though the sleeve 18 with the thread portion 125 exposed out of the sleeve 18. At this stage, the free end of the column 182 is interferentially engaged on the locking portion 124. The spring leaf 14 and the pillow 16 are disposed between the head 121 and the sleeve 18.

Referring also to FIGS. 3-4, to assemble the heat dissipating device, the spring leaf 14 rests on the base 22 of the heat sink 20. The flange 184 of the sleeve 18 is beneath the base 22. An upper side of the column 182 is extended through the hole 222 of the heat sink 20 and interferentially locked on the locking portion 124 of the post 12. The thread portion 125 of the post 12 is extended beyond the bottom rim of the flange 184. The pillow 16 receives the neck 123 of the post 12 in the bore 162 and rests on a top of the column 182. The spring leaf 14 loosely receives the neck 123 in the aperture 143 and rests on a top of the pillow 16. Here, the sleeve 18 can move up and down along an axial of the hole 222 of the base 22.

In the embodiment, the spring leaf 14 and the pillow 16 are loosely clothed on the neck 123 of the post 12, such that the spring leaf 14 can not rotate while the post 12 rotates. The flange 184 is beneath the base 22 of the heat sink 20 so that the locking device 10 can not part away the heat sink 20. The flange 184 can be received in the flute 224 of the base 22 of the heat sink 20, thereby amplifying a range that the locking device 10 moves up and down along an axial of the hole 222 of the base 22.

when assembling the heat sink 20 on the electronic component, the heat sink 20 combined with the locking device 10 is mounted on the electronic component. The post 12 is rotated by working on the project 122 of the head 121, until the thread portion 125 of the post 12 is engaged with the circuit board. Thus the heat sink 20 is securely mounted on the electronic component.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A combination comprising:

a heat sink comprising a base;

two locking devices incorporated with the heat sink, for securing the heat sink, each of the locking devices comprising:

a spring member elastically resting on the base, for pressing the heat sink;

a post having one end thereof engaging with the spring member; and a sleeve movably engaged in the base, having one end tightly grasping the post, and an opposite end thereof preventing the locking device from departing from the heat sink;

wherein the post extends through the sleeve, an opposite end of the post extends beyond said opposite end of the sleeve for locking the combination;

wherein the spring member is supported by said one end of the sleeve and loosely receives said one end of the post therein; and wherein the spring member comprises a spring leaf and a pillow beneath the spring leaf for supporting the spring leaf.

2. The combination of claim 1, wherein the base has a first surface and a second surface opposite to the first surface and defines two holes through the first surface and the second surface, the two locking devices are positioned in the holes of the base and the sleeve extends through said one of the holes, and the spring member elastically rests on the first surface of the base above one of the holes.

3. The combination of claim 2, wherein the sleeve is capable of freely moving in said one of the holes by operating the post.

4. The combination of claim 1, wherein the post forms a head at said one end thereof, and the head abuts against the spring member.

5. The combination of claim 1, wherein the post forms a locking portion below said one end thereof, and wherein said one end of the sleeve interferentially receives the locking portion therein.

6. The combination of claim 1, wherein the spring leaf comprises a shoulder and two elastic arms extending from the shoulder.

7. The combination of claim 6, wherein the shoulder defines an aperture in a center thereof, and a cutout at a rim of the aperture thereof.

8. The combination of claim 7, wherein the pillow defines a bore in a center thereof, and forms a tab at a rim of the bore thereof received in the cutout of the shoulder.

9. A combination for cooling a heat-generating component, comprising:

a heat sink comprising a base having a first surface for dissipating heat from said component and a second surface opposite to said first surface to thermally contact with said component, and at least one hole in communication with said first and second surfaces; and a locking device partially received in said at least one hole of said base, comprising a sleeve extending through said at least one hole and a post extending in said sleeve with two ends thereof exposed out of said sleeve, one of said two ends of said post resiliently movable beside said first surface without entering said at least one hole and the other of said two ends of said post fixable to a surrounding of said component in order for fixing said heat sink onto said component, one end of said sleeve extending out of said first surface engaged with said post, and the other end of said sleeve movable around said second surface without entering said at least one hole so as to maintain partial stay of said post in said at least one hole;

wherein said one end of the sleeve forms a column to engage with said post while said other end of said sleeve forms a flange receivable in a flute formed on said second surface of said base.

10. The combination of claim 9, further comprising a spring member disposed between said first surface of said base and said one of said two ends of said post so as to contribute to resilient movement of said one of said two ends of said post beside said first surface.

11. The combination of claim 9, wherein said spring member is a spring leaf with two elastic arms stretching out away from said post.

12. The combination of claim 11, further comprising a pillow disposed between said spring member and said first surface of said base, said pillow having a tab engagable with said spring member so as to limit a stretching direction of said two elastic arms.

13. The combination of claim 9, wherein said one of said two ends of said post forms a head having a size larger than said at least one hole so as to resiliently move beside said first surface without entering said at least one hole, said one end of said sleeve engaged with a neck of said post next to said head.

14. A combination comprising:

a heat sink comprising a base defining two through holes therein; and two locking devices for securing the heat sink, each of the locking devices comprising:

a spring member resting on the base of the heat sink above one of the holes, for elastically pressing the base of the heat sink;

a post having a head at one end thereof, and engaging with the spring member beneath the head; and a sleeve movably received in said one of the holes, locked on the post beneath the spring member, the sleeve comprising a bottom end grasping the base of the heat sink for holding the post to the heat sink;

wherein, a bottom end of the post is extended beyond the bottom end of the sleeve for locking the combination;

wherein the two holes are defined at a center of a couple of opposite sides of the base; and wherein two flutes are defined in the base beneath the holes respectively and communicating with the holes.

15. The combination of claim 14, wherein the bottom end of the sleeve is received in a corresponding flute when the locking device moves upwardly.

* * * * *